US009348236B2

(12) United States Patent
Helmus et al.

(10) Patent No.: US 9,348,236 B2
(45) Date of Patent: May 24, 2016

(54) ELECTROSTATIC CLAMP, LITHOGRAPHIC APPARATUS AND METHOD OF MANUFACTURING AN ELECTROSTATIC CLAMP (75) Inventors: Peter Richard Helmus, New Milford, CT (US); Matthew Lipson, Stamford, CT (US); Ronald A. Wilklow, Fairfield, CT (US); James Kennon, Benicia, CA (US); Kennard White, El Cerrito, CA (US); Wilbur Jordan Reichmann, II, San Pablo, CA (US)

(73) Assignee: ASML HOLDING N.V., Veldhoven (NL)

( * ) Notice: Subject to any disclaimer, the term of this patent is extended or adjusted under 35 U.S.C. 154(b) by 189 days.

(21) Appl. No.: 13/991,089

(22) PCT Filed: Sep. 21, 2011

(86) PCT No.: PCT/EP2011/066387
§ 371 (c)(1),
(2), (4) Date: Aug. 7, 2013

(87) PCT Pub. No.: WO2012/076207
PCT Pub. Date: Jun. 14, 2012

(65) Prior Publication Data
US 2013/0308116 A1    Nov. 21, 2013

Related U.S. Application Data (60) Provisional application No. 61/421,076, filed on Dec. 8, 2010.

(51) Int. Cl.
*H01L 21/683*    (2006.01)
*H01T 23/00*    (2006.01)
(Continued)

(52) U.S. Cl.
CPC ........ *G03F 7/70708* (2013.01); *G03F 7/70691* (2013.01); *H01L 21/6833* (2013.01); *H02N 13/00* (2013.01)

(58) Field of Classification Search
CPC ........................... G03F 7/70708; H02N 13/00
USPC .......................................... 361/234
See application file for complete search history.

(56) References Cited

U.S. PATENT DOCUMENTS 4,502,094 A * 2/1985 Lewin et al. .................. 361/234
5,634,266 A * 6/1997 Sherstinsky et al. ............ 29/825
(Continued)

FOREIGN PATENT DOCUMENTS

EP    1 780 601    5/2007
JP    H07-142555    6/1995
(Continued)

OTHER PUBLICATIONS

International Search Report mailed Dec. 27, 2011 in corresponding International Patent Application No. PCT/EP2011/066837.
(Continued)

*Primary Examiner* — Thienvu Tran
*Assistant Examiner* — Lucy Thomas
(74) *Attorney, Agent, or Firm* — Pillsbury Winthrop Shaw Pittman LLP (57) ABSTRACT An electrostatic clamp for use in a lithographic apparatus includes burls and an electrode surrounded by an insulator and/or a dielectric material between adjacent burls. In an embodiment, two or more layers of dielectric material are provided between adjacent burls and surround an electrode provided between adjacent burls. The electrostatic clamp may be used to clamp an object to an object support in a lithographic apparatus.

22 Claims, 6 Drawing Sheets (51) Int. Cl.
 *G03F 7/20* (2006.01)
 *H02N 13/00* (2006.01)

(56) References Cited

U.S. PATENT DOCUMENTS

| | | | |
|---|---|---|---|
| 5,880,924 | A | 3/1999 | Kumar et al. |
| 6,107,192 | A * | 8/2000 | Subrahmanyan et al. .... 438/637 |
| 6,117,246 | A | 9/2000 | Parkhe et al. |
| 6,426,790 | B1 | 7/2002 | Hayashi |
| 6,673,714 | B2 * | 1/2004 | Lee et al. ............... 438/637 |
| 7,187,433 | B2 * | 3/2007 | Ottens et al. ............ 355/72 |
| 7,585,386 | B2 | 9/2009 | Okumura et al. |
| 7,940,511 | B2 | 5/2011 | Sijben |
| 8,098,475 | B2 | 1/2012 | Sijben |
| 2003/0233977 | A1 | 12/2003 | Narendar et al. |
| 2004/0040665 | A1 | 3/2004 | Mizuno et al. |
| 2004/0114124 | A1 | 6/2004 | Hoeks et al. |
| 2004/0131775 | A1 | 7/2004 | Blaedel et al. |
| 2005/0248746 | A1 | 11/2005 | Zaal et al. |
| 2007/0097346 | A1 | 5/2007 | Zaal et al. |
| 2007/0103666 | A1 | 5/2007 | Ottens et al. |
| 2007/0116939 | A1 | 5/2007 | Benitsch et al. |
| 2007/0217114 | A1 | 9/2007 | Sasaki et al. |
| 2008/0024743 | A1 | 1/2008 | Kruit et al. |
| 2009/0168291 | A1 | 7/2009 | Koyama et al. |
| 2009/0284894 | A1 * | 11/2009 | Cooke ..................... 361/234 |
| 2010/0063568 | A1 * | 3/2010 | Staunton et al. ........... 607/116 |
| 2011/0222033 | A1 * | 9/2011 | Ten Kate ............ G03F 7/70875 355/30 |

FOREIGN PATENT DOCUMENTS

| | | |
|---|---|---|
| JP | H10-273371 | 10/1998 |
| JP | 2000-340640 | 12/2000 |
| JP | 2004-022888 | 1/2004 |
| JP | 2010-161319 | 7/2010 |
| JP | 2010-522997 | 7/2010 |
| JP | 2010-258280 | 11/2010 |
| KR | 2009-0129761 | 12/2009 |
| WO | 2009/036995 | 3/2009 |

OTHER PUBLICATIONS

J. van Elp et al., "Anodic bonding using the low expansion glass ceramic Zerodur®," J. Vac. Sci. Technol. B, vol. 23, No. 1, pp. 96-98 (Jan./Feb. 2005).

Taiwanese Office Action dated Aug. 13, 2015 in corresponding Taiwanese Patent Application No. 100136322.

Japanese Office Action mailed Sep. 2, 2015 in corresponding Japanese Patent Application No. 2013-542421.

* cited by examiner

Fig.1

Prior Art

Fig. 2

Prior Art

Fig. 3

Prior Art

Fig. 4

Prior Art

Fig. 11

US 9,348,236 B2

ELECTROSTATIC CLAMP, LITHOGRAPHIC APPARATUS AND METHOD OF MANUFACTURING AN ELECTROSTATIC CLAMP

CROSS-REFERENCE TO RELATED APPLICATIONS

This application is the U.S. national phase entry of PCT Patent Application No. PCT/EP2011/066387, filed on Sep. 21, 2011, which claims the benefit of priority of U.S. provisional application 61/421,076, which was filed on 8 Dec. 2010, and which is incorporated herein in its entirety by reference.

FIELD

The present invention relates to an electrostatic clamp to hold an object, a lithographic apparatus including such a clamp, and a method relating to such clamp.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, e.g. a mask (reticle), may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

An electrostatic clamp is a clamp that operates to clamp an object using electrostatic force. Such a clamp may be used in a lithographic apparatus. For example, a lithographic apparatus using EUV or electron beam radiation may operate in certain regions under vacuum conditions. An electrostatic clamps may be useful to clamp an object in such regions. An electrostatic clamp may be provided to electrostatically clamp an object, such as a mask or a substrate (wafer) to an object support, such as a mask table or substrate table, respectively.

Figure 2:
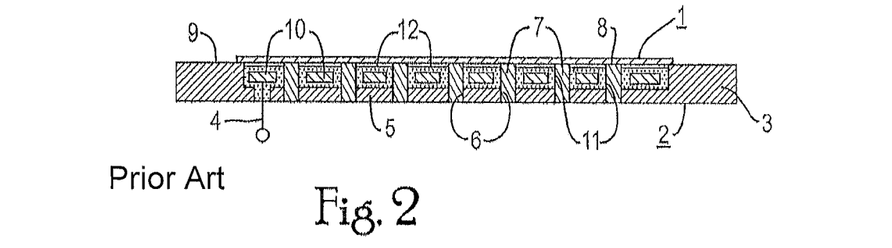
FIG. 2 is a cross-sectional view, taken on the line I-I' of FIG. 3, of a substrate located on a conventional electrostatic chuck.
Figure 3:
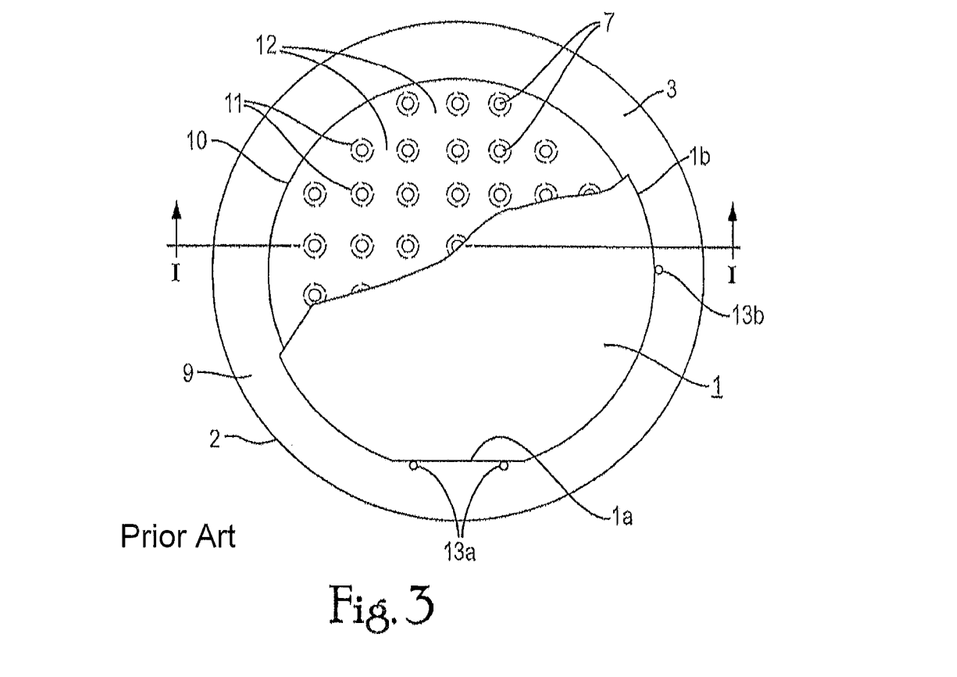
FIG. 3 is a plan view, taken from above, of the substrate and the chuck of FIG. 2, the substrate being partially cut away.

FIGS. 2 and 3 depicts a substrate 1 located on an electrostatic chuck (clamp) 2 which includes a thermally conductive support 3, 5 made of, for example, aluminum. To position the substrate 1 on the chuck 2, locating pins 13a, 13b may be provided so that the flat edge 1a of substrate 1 can abut pins 13a and the rounded edge 1b abuts pin 13b so that the location of the substrate 1 can be uniquely defined. The support has a peripheral portion 3 which may be 6 mm thick and a thinner, perforated central portion 5 having a thickness of approximately 3.5 mm. The central portion has perforations or apertures 6 which are circular in cross section with a diameter of 3 mm. The electrostatic chuck 2 also includes thermally conductive portions in the form of copper pillars 7 which are secured in the apertures 6. The pillars 7, which are 6 mm long and have a diameter of 3 mm, are in thermal contact with the central portion of the support and also with the peripheral portion 3 which because of its relatively large size, can act as a heat sink.

The pillars 7 have flat end faces 8 which lie in the same fixed plane so that the substrate 1 can bear on them as well as on the major surface 9 of the peripheral portion 3 of the support. In this way, the substrate may be supported in a fixed plane relative to the electrostatic chuck 2. Moreover, because the pillars 7 are made of metal they are electrically (as well as thermally) conductive so that the substrate 1 is electrically contacted at its back surface (i.e. the surface facing the electrostatic chuck 2) by the pillars 7.

The chuck 2 also has an electrically conductive member in the form of a grid electrode 10 which may be made of, for example, aluminum. Essentially the grid 10 is circular, having a diameter of 90 mm and a thickness of 1.3 mm. The meshes of the grid 10 may be constituted by circular apertures 11 which have a diameter of 5 mm. The grid 10 has parts which extend between the pillars 7 because it is located such that the pillars 7 extend through the apertures 11, but the pillars 7 and grid 10 are mutually insulated by a layer of dielectric material 12. The layer 12 of dielectric material, which may be, for example, an epoxy resin, surrounds the grid 10 so that, in addition to insulating the grid from the pillars 7, the grid 10 is also insulated from the central portion 5 of the support. The separation of the grid 10 from both the pillars 7 and the central portion 5 of support 2 is, for example, 1 mm, the dielectric layer 10 filling the whole space between these various members. In addition the dielectric layer is present on the upper surface of grid 10 but this part of layer 10 has a thickness of approximately 200 micrometers. As explained in more detail hereinafter, the pillars 7 may protrude from the dielectric layer 12 so that the substrate 1 is spaced apart from layer 12 by approximately 10 micrometers.

To hold the substrate 1 against the chuck 2 a potential difference is applied between the substrate 1 and the grid electrode 10. Typically this potential difference is 4 kV. Electrical contact is made to the back surface of substrate 1 via pillars 7 from the support 2 and a bias potential of, for example, approximately 4 kV is applied to grid 10 via an electrical connection 4 extending through the central portion 5 of the support and through the dielectric layer 12. Thus an electrostatic clamping force is established across the dielectric layer 12 so that the substrate 1 is held in a substantially fixed plane against the pillars 7 of the chuck 2. The magnitude of the clamping force is proportional to the square of the potential difference between substrate 1 and electrode 10, directly proportional to the dielectric constant of layer 12, and inversely proportional to the square of the distance between the substrate 1 and the grid 10.

FIG. 3 is a plan view, taken from above, of the substrate 1 and the chuck 2 of FIG. 2 with the substrate 1 being partially cut away. FIG. 2 shows a cross section along the line I-I' of FIG. 3. As shown in FIG. 3, the chuck 2 has a symmetrical distribution of pillars 7. In order to hold the substrate evenly against the chuck, it is desirable that the pillars 7 are relatively closely spaced to avoid localized bowing of the substrate. This is also consistent with the need to avoid temperature variations across the substrate 1. The greater the number of pillars 7 and the closer their spacing the more efficient can be the transfer of heat from the substrate to the thick peripheral heat sink 3 of the support. But, as far as the number of pillars is concerned, a compromise has to be reached because the contact pressure due to electrostatic attraction is reduced as the number of pillars 7 is increased. However, because the pillars 7 protrude from dielectric layer 12, the substrate 1 contacts the chuck 2 only at the end faces 8 of the pillars 7 and at the inner periphery of the major surface 9. By limiting the contact area in this way the contact pressure (i.e. force per unit area) is maximized. This is beneficial because the efficiency of heat transfer between the substrate 1 and the pillars 7 depends on the contact pressure.

SUMMARY

The object which is clamped on the electrostatic clamp should be positioned with a very high accuracy on the electrostatic clamp and the position of the object on the electrostatic clamp should to be stable over time. It would be beneficial, for example, to provide an electrostatic clamp which gives a high accuracy and stability of the position of the object.

According to an aspect of the invention, there is provided an electrostatic clamp configured to hold an object in a substantially fixed plane. The clamp includes: a support including a base and a plurality of burls extending from the base. Each of the plurality of burls includes a top and a bottom portion, and the top of the burls determines a plane in which the object is held. The clamp also includes a first layer of material and a second layer of material provided between adjacent burls, the first and second layers not extending higher than the top portions and not extending lower than the bottom portions of the adjacent burls. An electrode is provided between the adjacent burls and surrounded by the first and second layers.

According to an aspect of the invention, there is provided a method of manufacturing an electrostatic clamp configured to electrostatically clamp an object to an object support. The electrostatic clamp includes a support including a base and a plurality of burls extending from the base, each of the plurality of burls including a top and a bottom portion, and the top of the burls determining a plane in which the object is held. The method includes: providing a first layer of material over the base and tops of the burls; providing an electrode over the base and the burls, including the first layer; etching first recesses around the plurality of burls in at least the first layer such that at least the first layer is a first distance away from the burls; providing a second layer of material over the base including the first layer, the first recesses, and the tops of the burls; and etching second recesses around the plurality of burls in at least the second layer such that at least the second layer of material is a second distance away from the burls.

According to an aspect of the invention, there is provided an apparatus including: an object support to support an object in a beam path of a radiation beam; and an electrostatic clamp to electrostatically clamp the object against the object support, the clamp comprising: a support including a base and a plurality of burls extending from the base, each of the plurality of burls including a top and a bottom portion, the top of the burls determining a plane in which the object is held; a first layer of material and a second layer of material provided between adjacent burls, the first and second layers not extending higher than the top portions and not extending lower than the bottom portions of the adjacent burls; and an electrode provided between the adjacent burls and surrounded by the first and second layers.

According to an aspect of the invention, there is provided a lithographic apparatus including: a patterning device support to hold a patterning device, the patterning device configured to pattern a beam of radiation to form a patterned beam of radiation; a substrate support to hold a substrate; a projection system to project the patterned beam of radiation onto the substrate; and an electrostatic clamp to electrostatically clamp the patterning device or the substrate on the respective support. The clamp includes: a table including a base and a plurality of burls extending from the base. Each of the plurality of burls includes a top and a bottom portion, and the top of the burls determine a substantially planar surface on which the patterning device or the substrate is held. The clamp also includes a first layer of material and a second layer of material provided between adjacent burls, the first and second layers not extending higher than the top portions and not extending lower than the bottom portions of the adjacent burls, and an electrode provided between the adjacent burls and surrounded by the first and second layers.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
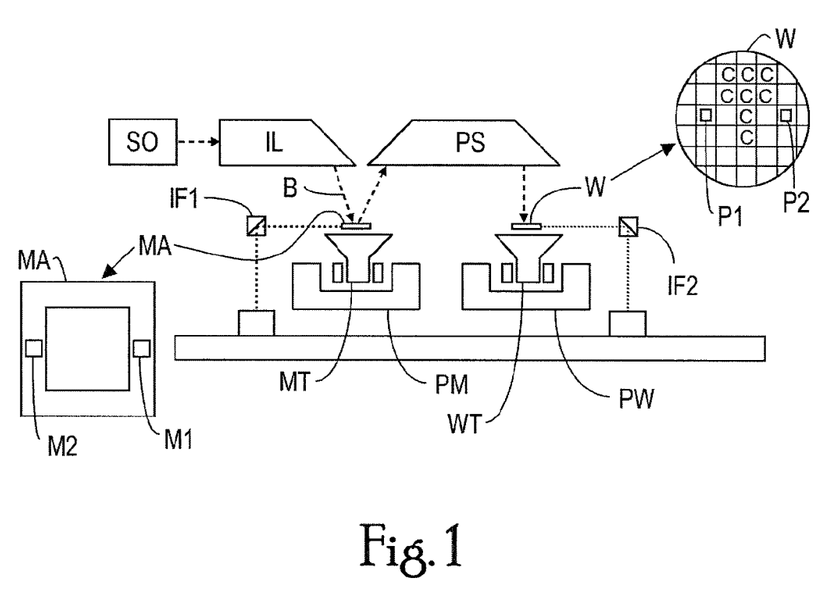
FIG. 1 depicts a lithographic apparatus in accordance with an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a support structure or support or pattern support (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device. It may hold the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The support structure and the substrate table may also be hereinafter referred to as an article support. An article includes but is not limited to a patterning device, such as a reticle, and a substrate, such as a wafer.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected by the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 4:
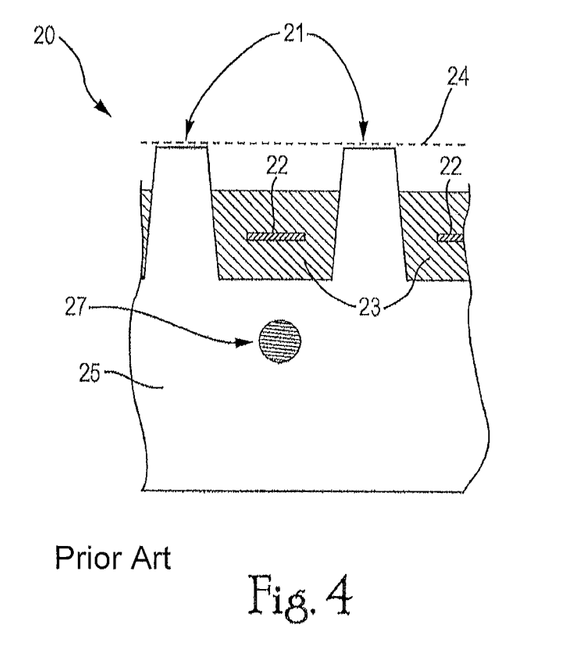
FIG. 4 depicts a partial cross section of the top layer of an electrostatic clamp according to an embodiment of the invention.

FIG. 4 depicts a partial cross section of an electrostatic clamp according to an embodiment of the invention. In the embodiment shown in FIG. 4, the electrostatic clamp 20 is configured to, in use, hold an object in a substantially fixed plane 24 and includes a support or table 25 provided with burls 21. The top of the burls 21 determine the plane 24 in which the object is held and an electrode 22 surrounded (e.g. encapsulated) by a dielectric 23 is provided in between the burls 21. The dielectric 23 functions also as an insulator. The substantially fixed plane (or substantially planar surface) may correspond to a plane in which the substrate is held during substrate exposure. The distance between the electrode 22 and the top of the burls 21 may be between 50 and 1000 μm. While only two burls 21 are shown in FIG. 4 it will be appreciated that in general multiple burls may be used and that the electrode 22 and the dielectric material 23 may be located in between each of those burls 21. In an embodiment, the support 25 provided with the burls 21 may be made from one material so that the position of the burls 21 on the support 25 is very stable and rigid which helps to keep the object stable on its position in the plane 24. To improve the stability, the support 25 may be a factor of 10 to 200 thicker than the height of the burls 21. For example the support may be about 40 mm thick with a height of the burl of about 300 μm.

The top of the burls 21 determines the plane 24 (or a substantially planar surface) in which the object is held. The top of the burls 21 may be in contact with the object and this contact may require the material of the burl 21 to be wear resistant since every time an object is clamped on the burls 21 forces are exerted on the burls 21 which may cause wear of the burls 21. Wear may make the burls 21 of the clamp 20 more sensitive to sticking effects. Sticking effects are generally due to adhesion forces between the bottom section of the object and the top section of the burls 21, and/or due to electrostatic forces generated by residual electrostatic charges. Adhesion forces may be generated by material impurities, and roughness imperfection of the contacting surfaces. Objects may slip over the burls 21, thereby causing wear and roughness imperfection on the burls 21, which may lead to additional sticking. Another cause of wear may be the cleaning of the burls 21 that is desirable when contaminants stick to burls 21.

The object which is clamped on the electrostatic clamp 20 should be positioned with a very high accuracy and the position of the object on the electrostatic clamp 20 should be stable over time. If copper and aluminum is used for the burls 21 and the support 25 respectively the position may not be guaranteed with a sufficiently high accuracy because the thermal expansion of the metals (16.5 m/m·K×10$^{-6}$ and 22.5 m/m·K×10$^{-6}$ respectively) is high. A high thermal expansion may give a risk to unflatness and movement in the plane 24 of the burls 21 if the clamp 20 changes in temperature. The difference in expansion coefficient of different materials used in the clamp 20 may also or alternatively result in tensions between the materials and in unflatness of the clamp 20. A risk may be that the connection between the burls 21 and the support 25 may be too weak which makes that any tension caused by, for example, the electrode 22 or the dielectric 23 may result in unflatness of the clamp and/or translation of the burls 21 in the plane 24. It may therefore be beneficial to make the support 25 and the burls 21 out of one material. The connection between the two can be made with improved rigidity if its made out one piece, which overcomes any tensions within the clamp 20. The material of the support 25 provided with the burls 21 desirably has a thermal expansion of less than about 10 m/m·K×10$^{-6}$. The material may be for example SiC (silicon carbide which has a thermal expansion of 4 m/m·K×10$^{-6}$), SiSiC (siliconized silicon carbide which has a thermal expansion of 4 m/m·K×10$^{-6}$) or Si$_3$N$_4$ (silicon nitride, which has a thermal expansion 3.3 m/m·K×10$^{-6}$). An object that may need to be clamped on the electrostatic clamp 2 may be made of silicon (such as a substrate) and quartz (such as a reticle). Silicon has a thermal expansion of 2 to 3 m/m·K×10$^{-6}$ and quartz has a thermal expansion depending on its manufacturing process of 0.05 to 9 m/m·K×10$^{-6}$. The thermal expansion of the clamp 20 may be chosen such that it is close to the thermal expansion of the object clamped on the clamp 20 to reduce or minimize tension between the object and the electrostatic clamp 20. This results in a better flatness of the object on the clamp 20 and a more stable position of the object on the clamp 2.

The materials mentioned above are much harder than copper. The (Knoop 100 g) hardness of SiC and SiSiC is 2800 Kg/mm$^2$ corresponding to a Moh's hardness of 9-10 and Si$_3$N$_4$ has a (Knoop 100 g) hardness of 2200 Kg/mm$^2$ corresponding to a Moh's hardness of 9. As described above, hardness is important to avoid wear and adhesive forces of the burls 21. Copper has a Moh's hardness of about 3-5 which means it is much softer than the above mentioned silicon carbide and silicon nitride. As discussed herein, an object that may need to be clamped on the electrostatic clamp 2 may be made of silicon and/or quartz. Silicon has a Moh's hardness of between 6 and 7 and quartz has a Moh's hardness of 7 which makes that when copper is used for the burls 21 it is the burl that will wear. If the burls 21 wear, the position of the plane 24 may differ and the burls 21 may be sensitive to adhesive forces.

The thermal conductivity of SiC is 120 W/m·K and of silicon nitride is 30 W/m·K which is lower than that of copper which is 394 W/m·K or that of aluminum which is 237 W/m·K but in most applications this will be enough to get enough heat transport to the temperature control system. The temperature control system may use a liquid (e.g., water) duct 27 within the support 25 of the electrostatic 20 clamp to control the temperature of the clamp 2.

Creating a dielectric layer for a single-sided or double-sided clamp can have significant yield issues. Some of the manufacturing processes used to create a thin layer for an electrostatic clamp may be accompanied by various restrictions and limitations including, for example, pinholes and/or material instability. For example, some designs of electrostatic clamps utilize techniques such as gluing and/or anodic bonding as part of the manufacturing process to create a dielectric layer and a patterned electrode for an electrostatic clamp. Providing a stable layer on a clamp assists in providing a stable base to supporting a substrate.

Figure 5:
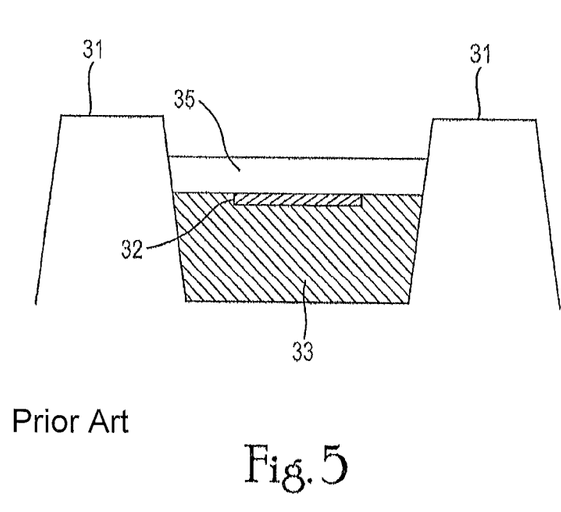
FIG. 5 depicts a partial cross section of the top layer of an electrostatic clamp according to an embodiment of the invention.

FIG. 5 depicts a partial cross section of the top layer of an electrostatic clamp according to an embodiment of the invention. In the embodiment shown in FIG. 4, the electrode 32 is surrounded by an insulator 33,35 and is provided in between the burls 31. In an embodiment, the insulator may be of dielectric material. In the embodiment of FIG. 5, a dielectric material layer 35 is provided above the electrode 32 and a insulator material layer (which may be dielectric) 33 is provided under the electrode 32. The dielectric material may be, for example, a plastic such as PARYLENE™ poly(p-xylene) polymer of Para Tech Coating, Inc, KAPTON™ polymide or MYLAR™ polyester, both of E.I. du Pont de Nemours and Company or a liquid crystal polymer (LCP). Quartz such as SCHOTT™ sealing glass, SCHOTT™ AF37 or SCHOTT BOROFLOAT™ 33 may be used as a dielectric material. Another material that may be used as an insulator and/or dielectric may be borium nitride.

FIGS. 6-9 illustrate detailed, partial cross-section views of steps of a manufacturing method for applying more than one layer to an electrostatic clamp according to an embodiment of the invention. More specifically, in the herein described embodiment, two or more layers of dielectric material (e.g., PARYLENE™) are applied onto a support of the electrostatic clamp, with an aluminum electrode between burls and surrounded by the dielectric layers. The multiple dielectric layers of this embodiment increase a minimum intrinsic breakdown strength and reduce local breakdown of the dielectric layer when radiation (e.g., EUV radiation) is applied. An increase in the number of dielectric layers can increase the thickness around an electrode, and thus can result in a decrease of the number of failures per clamp area. For example, many dielectric failures are defect driven. Using multiple layers can mitigate effects of defects in any one layer resulting in a greater minimum breakdown strength. Also, an amount of power or force to distort or deform the clamp is directly proportional to the thickness of the layers. That is, as the thickness of the dielectric layers increases, so does its strength, thus decreasing the susceptibility of the clamp to deform.

FIGS. 6-9 shows detailed views of the steps to manufacture an electrostatic clamp 40 that is configured to hold an object in a substantially fixed plane (in a similar manner as shown in FIG. 4). The electrostatic clamp 40 includes a support or table 42 comprising a base 43 and a plurality of burls 44 extending from the base 43. Each of the plurality of burls 44 includes a top portion and a bottom portion. Burls 44 comprise a height H that is measured from the bottom portion (or a surface of the support 42) to the top portion. In an embodiment, the burls 44 are provided at or between a height H in the range of approximately 85 µm. In an embodiment, a top of the burls determines a plane in which the object is held.

Figure 6:
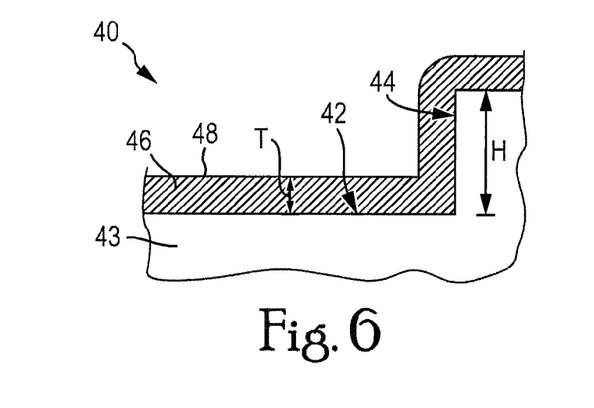
FIG. 6 illustrates a detailed, partial cross section view of a first step of a manufacturing method to apply more than one layer to an electrostatic clamp according to an embodiment of the invention.

FIG. 6 illustrates the surface of the support 42 provided or coated with a first layer 46 of material over the support 42 and its burls 44. The first layer 46 is provided over the base 43 and over the tops of the burls 44. An electrode layer 48 is also provided or coated at least between the burls 44. In the illustrated embodiment, the electrode 48 is fully coated over the first layer 46, over the base 43 and tops of the burls 44.

In an embodiment, the first layer 46 comprises a dielectric material. In an embodiment, the first layer 46 comprises a plastic. In an embodiment, the first layer 46 comprises PARYLENE™.

In an embodiment, the electrode 48 comprises aluminum.

A thickness T of the first layer 46 that is provided or coated onto the surface of the support 42 should not be limiting. In an embodiment, the thickness T of the first layer 46 of material is between and including approximately 20 microns and approximately 30 microns. In an embodiment, the thickness T of the first layer 46 is approximately 25 microns. In an embodiment, a thickness of the electrode is approximately 300 nm.

Figure 7:
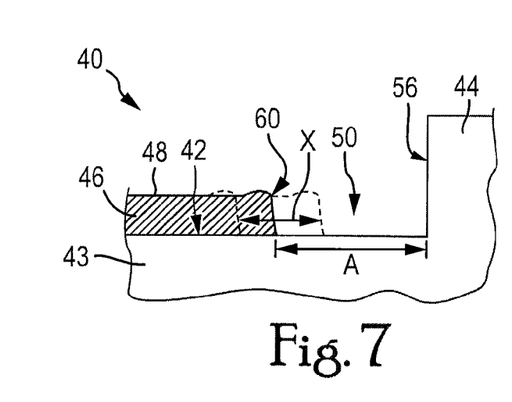
FIG. 7 illustrates a detailed, partial cross section view of a second step of a manufacturing method to apply more than one layer to an electrostatic clamp according to an embodiment of the invention.

In the next step, shown in FIG. 7, at least the first layer 46 is etched from the surface of the support 42. More specifically, at least the first layer 46 is etched such that first recesses 50 are formed in at least the first layer 46 in relation to and/or around the plurality of burls 44, so that the first layer 46 is a first distance A away from edges 56 of the burls 44. The electrode layer 48 may also be etched from the burls 44. In an embodiment, the first recesses 50 are formed by etching the first layer 46 and electrode layer 48 approximately 100 microns from the edges 56 of each burl 44 (i.e., A=approximately 100 microns). In an embodiment, the amount that the first layer 46 is etched is the distance A+/−X microns. In an embodiment, the first layer 46 is etched approximately 100+/−25 microns from the burls 44.

Figure 8:
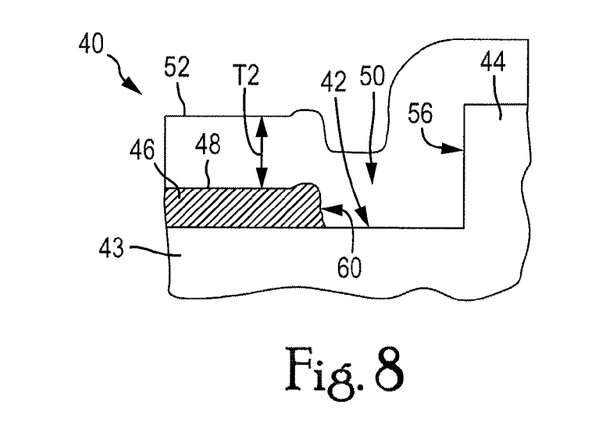
FIG. 8 illustrates a detailed, partial cross section view of a third step of a manufacturing method to apply more than one layer to an electrostatic clamp according to an embodiment of the invention.

In FIG. 8, the support 42 is provided or coated with a second layer 52 of material over the base 43, including over the first layer 46, the first recesses 50, and the tops of the plurality of burls 44. In an embodiment, the second layer 52 comprises a dielectric material. In an embodiment, the second layer 52 comprises a plastic. In an embodiment, the second layer 52 comprises PARYLENE™.

In an embodiment, the first layer 46 and the second layer 52 comprise similar material. In an embodiment, both the first layer 46 and the second layer 52 comprise PARYLENE™.

A thickness T2 of the second layer 52 that is provided or coated onto the surface of the support 42 (which includes over the first layer 46, first recesses 50, and burls 44) should not be limiting. In an embodiment, the thickness T2 of the second layer 52 is between and including approximately 40 microns and approximately 60 microns. In an embodiment, the thickness T2 of the second layer 52 is approximately 50 microns. In an embodiment, the thickness T2 of the second layer 52 is substantially uniform when coated onto the surface of the support 42. In an embodiment, the thickness T2 of the second layer 52 may be non-uniform along the surface of the support 42.

Figure 9:
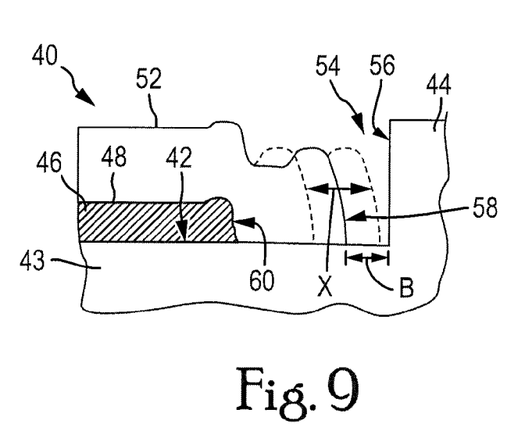
FIG. 9 illustrates a detailed, partial cross section view of a fourth step of a manufacturing method to apply more than one layer to an electrostatic clamp according to an embodiment of the invention.

Then, shown in FIG. 9, at least the second layer 52 is etched from the surface of the support 42. More specifically, at least the second layer 52 is etched such that second recesses 54 are formed in at least the second layer 52 in relation to and/or around the plurality of burls 44, so that the second layer 52 is a second distance B away from edges 56 of the burls 44. In an embodiment, the second recesses 54 are formed by etching the second layer 52 approximately 25 microns from each burl 44 (i.e., B=approximately 25 microns). In an embodiment, the amount that the second layer 52 is etched is the distance B+/−X microns (where X need not have the same value as for the first layer 46). In an embodiment, the second layer 52 is etched approximately 25+/−25 microns from the edges 56 of the burls 44. In an embodiment, the distance B is smaller than the distance A.

Application of the first and second layers 46, 52 should not be limiting. For example, in an embodiment, the first layer 46 and/or the second layer 52 is provided on the support using a sputtering process, using a chemical vapor deposition process, or a combination thereof. Additionally, etching of the first and second layers 46, 52 (i.e., etching first and second recesses 50, 54) may be performed any number of ways and should not be limiting. In an embodiment, to form first and second recesses, a laser ablation process is utilized.

Figure 10:
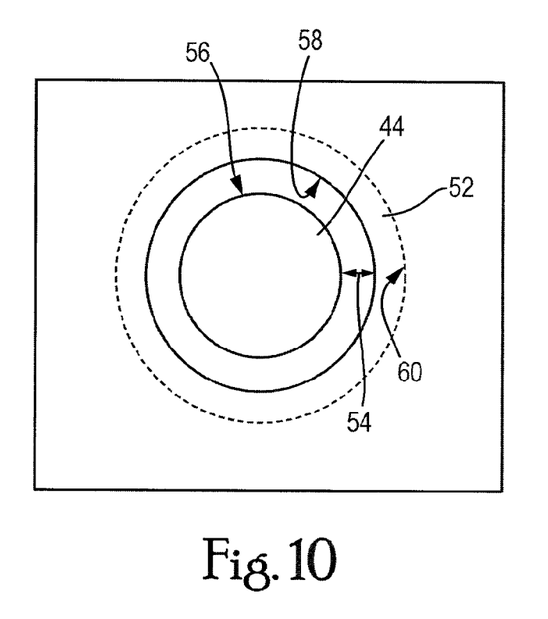
FIG. 10 is a detailed, plan view, taken from above, of a burl in accordance with an embodiment of the invention.

FIG. 10 illustrates a detailed, plan view, taken from above, of burl 44 on support 42 after etching and processing as shown in FIGS. 6-9, in accordance with an embodiment of the invention. Burl 44 has second recess 54 formed substantially there around between its edge 56 and an edge 58 of second layer 52. Edges 60 of the first layer 46 and electrode 48 are generally represented by a dashed line in FIG. 10 (because such layers are provided underneath second layer 52, due to etching the layers 46 and 48 the first distance A from burl 44, as shown in FIG. 7).

In an embodiment, first layer 46 and second layer 52 comprise dielectric materials. In one embodiment, first layer 46 and second layer 52 comprise PARYLENE™.

In an embodiment, burl 44 comprises a diameter of approximately 500 micron. The first and electrode layers 46 and 48 of material may be removed up to approximately 700+/−micron diameter from around the burl 44. The second layer 52 of material may be removed up to approximately 550+/−micron diameter surrounding the burl 44.

Figure 11:
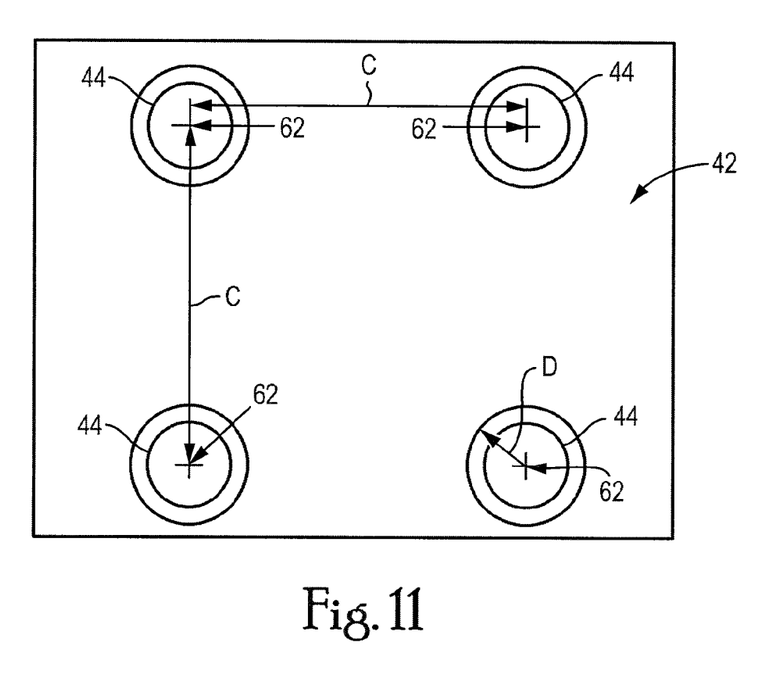
FIG. 11 illustrates a detailed, plan view of an electrode area in accordance with an embodiment of the invention.

While only part of one burl 44 is shown in FIGS. 6-10, it will be appreciated that in general multiple burls may be used and that the electrode 48 and the layers of materials 46, 52 may be located in between each of those burls 44. FIG. 11 illustrates a detailed, plan view of a support 42 with a base and a plurality of burls 44 in accordance with an embodiment of the invention. In an embodiment, the support 42 provided with the burls 44 may be made from one material so that the position of the burls 44 on the support 42 is stable and rigid which helps to keep the object stable on its position in the plane.

To improve the stability, the support 42 may be a factor of 10 to 200 times thicker than the height of the burls 44. For example, in an embodiment, the support may be about 500 µm in diameter, with a height H of the burl of approximately 85 µm. A distance C between centers 62 of adjacent burls may be up to approximately 2 mm (millimeters).

A distance D from a burl center 62 to edge 58 of the layers 52, 48, and 46 should not be limited. A square unit cell may be measured using the burl centers 62, e.g., forming a 2 mm by 2 mm or 4 mm² area. In an embodiment, a distance D from a burl center 62 to edge 58 of the layers 52, 48, and 46 may be approximately 375 µm. Then the area formed by the 4 mm² may have approximately 89% coverage of layers 46, 52 and electrode 48.

In an embodiment, a distance between the electrode 48 and the top of the burls 44 may be between 50 and 1000 µm.

The support 42, its base 43, and the plurality burls 44 of the embodiment of FIGS. 6-9 as well as the illustrated embodiments in FIGS. 10 and 11 may be made out of one or more materials, including but not limited to those disclosed above, and should not be limiting.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. An electrostatic clamp to hold an object in a substantially fixed plane, the clamp comprising:
    a support including a base and a plurality of burls extending from the base, each of the plurality of burls including a top and a bottom portion, the top of the burls determining a plane in which the object is held;
    a first layer of material and a second layer of material provided between adjacent burls, the first and second layers not extending higher than the top portions and not extending lower than the bottom portions of the adjacent burls and wherein the first layer is out of direct contact with, and spaced apart by a first lateral distance away from, each burl; and
    an electrode provided between the adjacent burls and surrounded collectively by the first and second layers.

2. The electrostatic clamp according to claim 1, wherein the second layer is out of direct contact with, and spaced apart by a second lateral distance away from, each burl.

3. The electrostatic clamp according to claim 1, wherein the second layer is provided within at least part of an area formed by the first distance between the first layer and the respective burl.

4. The electrostatic clamp according to claim 1, wherein the first layer and the second layer are similar materials.

5. The electrostatic clamp according to claim 1, wherein the second layer is provided on top of the first layer.

6. The electrostatic clamp according to claim 1, wherein the first layer, the second layer, or both, comprise dielectric material and the dielectric material is poly(p-xylene) polymer.

7. The electrostatic clamp according to claim 6, wherein both the first layer and the second layer comprise poly(p-xylene) polymer.

8. The apparatus according to claim 1, wherein the first lateral distance is greater than or equal to about 25 microns.

9. A method of manufacturing an electrostatic clamp configured to electrostatically clamp an object to an object support, the electrostatic clamp comprising a support including a base and a plurality of burls extending from the base, each of the plurality of burls including a top and a bottom portion, the top of the burls determining a plane in which the object is held, the method comprising:
   providing a first layer of material over the base and tops of the burls;
   providing an electrode over the base and the burls, including the first layer;
   etching first recesses around the plurality of burls in at least the first layer such that at least the first layer is out of direct contact with, and is a first distance away from, the burls;
   providing a second layer of material over the base including the first layer, the first recesses, and the tops of the burls; and
   etching second recesses around the plurality of burls in at least the second layer such that at least the second layer of material is out of direct contact with, and is a second distance away from, the burls.

10. The method according to claim 9, wherein the first layer and the second layer are similar materials.

11. The method according to claim 9, wherein the first layer, the second layer, or both, comprise dielectric material.

12. The method according to claim 11, wherein the dielectric material is poly(p-xylene) polymer.

13. The method according to claim 11, wherein both the first layer and the second layer comprise poly(p-xylene) polymer.

14. The method according to claim 9, wherein the providing the first layer and/or the second layer comprises using a sputtering process, using a chemical vapor deposition process, or both.

15. The method according to claim 9, wherein the etching the first recesses and/or etching the second recesses comprises using a laser ablation process.

16. An apparatus comprising:
   an object support to support an object in a beam path of a radiation beam; and
   an electrostatic clamp to electrostatically clamp the object against the object support, the clamp comprising:
     a support including a base and a plurality of burls extending from the base, each of the plurality of burls including a top and a bottom portion, the top of the burls determining a plane in which the object is held;
     a first layer of material and a second layer of material provided between adjacent burls, the first and second layers not extending higher than the top portions and not extending lower than the bottom portions of the adjacent burls and wherein the first layer is out of direct contact with, and spaced apart by a lateral distance away from, each burl; and
     an electrode provided between the adjacent burls and surrounded collectively by the first and second layers.

17. The apparatus according to claim 16, wherein the object is a substrate to be exposed by the radiation beam.

18. The apparatus according to claim 16, wherein the object is a patterning device configured to pattern the beam of radiation.

19. The apparatus according to claim 16, wherein both the first layer and the second layer comprise poly(p-xylene) polymer.

20. The apparatus according to claim 16, wherein the apparatus is a lithographic apparatus and comprises a patterning device support to hold a patterning device, the patterning device configured to pattern a beam of radiation to form a patterned beam of radiation, comprises a substrate support to hold a substrate, and comprises a projection system to project a patterned beam of radiation onto the substrate, wherein the object support is the patterning device support or the substrate support.

21. The apparatus according to claim 16, wherein the second layer is out of direct contact with, and spaced apart by a lateral distance away from, each burl.

22. The apparatus according to claim 16, wherein the first lateral distance is greater than or equal to about 25 microns.

* * * * *